United States Patent
Hirose et al.

(10) Patent No.: US 11,271,147 B2
(45) Date of Patent: Mar. 8, 2022

(54) PIEZOELECTRIC COMPOSITION AND PIEZOELECTRIC ELEMENT

(71) Applicant: TDK CORPORATION, Tokyo (JP)

(72) Inventors: Masakazu Hirose, Tokyo (JP); Yuiko Hirose, Tokyo (JP); Hiroki Katoh, Tokyo (JP); Tamotsu Sasaki, Tokyo (JP); Yuji Umeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/040,310

(22) PCT Filed: Mar. 19, 2019

(86) PCT No.: PCT/JP2019/011577
§ 371 (c)(1),
(2) Date: Sep. 22, 2020

(87) PCT Pub. No.: WO2019/181977
PCT Pub. Date: Sep. 26, 2019

(65) Prior Publication Data
US 2021/0091298 A1   Mar. 25, 2021

(30) Foreign Application Priority Data

Mar. 23, 2018 (JP) .............................. JP2018-056823

(51) Int. Cl.
*H01L 41/187* (2006.01)
*C04B 35/495* (2006.01)

(52) U.S. Cl.
CPC ........ *H01L 41/1873* (2013.01); *C04B 35/495* (2013.01); *C04B 2235/3201* (2013.01); *C04B 2235/3241* (2013.01); *C04B 2235/3251* (2013.01); *C04B 2235/3255* (2013.01); *C04B 2235/3279* (2013.01); *C04B 2235/3281* (2013.01); *C04B 2235/3284* (2013.01); *C04B 2235/768* (2013.01)

(58) Field of Classification Search
CPC ............... H01L 41/1873; C04B 35/495; C04B 2235/3241; C04B 2235/3251; C04B 2235/3279; C04B 2235/3281; C04B 2235/3284; C04B 2235/3201; C04B 2235/768

See application file for complete search history.

(56) References Cited

U.S. PATENT DOCUMENTS

| 11,005,028 B2 * | 5/2021 | Katoh ................. H01L 41/1873 |
| 2006/0006360 A1 * | 1/2006 | Takao ..................... H01B 3/12 252/62.9 R |
| 2008/0061263 A1 | 3/2008 | Kawada et al. |
| 2009/0121589 A1 | 5/2009 | Kaigawa et al. |

FOREIGN PATENT DOCUMENTS

| EP | 2157066 A2 | 2/2010 |
| JP | 2014-177355 A | 9/2014 |
| KR | 101043041 B1 | 6/2011 |
| WO | 2006/117990 A1 | 11/2006 |

OTHER PUBLICATIONS

Jun. 4, 2019 International Search Report issued in International Patent Application No. PCT/JP2019/011577.
Sep. 29, 2020 International Preliminary Report on Patentability issued in International Patent Application No. PCT/JP2019/011577.

* cited by examiner

*Primary Examiner* — C Melissa Koslow
(74) *Attorney, Agent, or Firm* — Oliff PLC

(57) ABSTRACT

A piezoelectric composition containing: a complex oxide having a perovskite structure represented by a general formula of $ABO_3$; copper; and one or more elements selected from the group consisting of chromium, nickel and zinc, in which in $ABO_3$, an A-site element is potassium and a B-site element is niobium, or niobium and tantalum, with respect to 1 mol of the complex oxide, a content ratio of the copper is $\alpha$ mol % in terms of CuO, a content ratio of one or more elements selected from the group consisting of chromium, nickel and zinc is $\beta$ mol % in terms of $CrO_{3/2}$, NiO, ZnO, $\alpha$ satisfies a relationship of $0.2 \leq \alpha \leq 2.5$, and $\beta$ satisfies a relationship of $0.2 \leq \beta \leq 2.0$.

4 Claims, 2 Drawing Sheets

[FIG. 1]
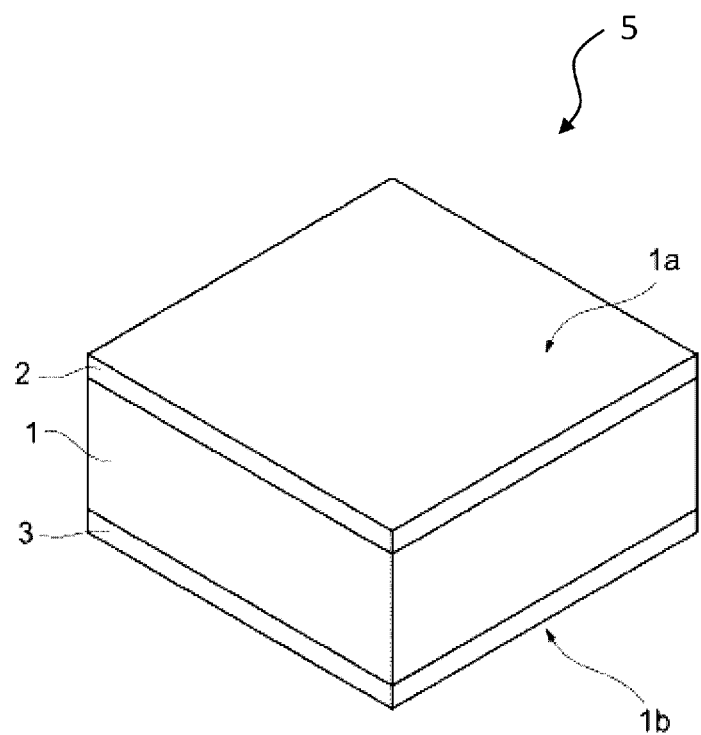

[FIG. 2]
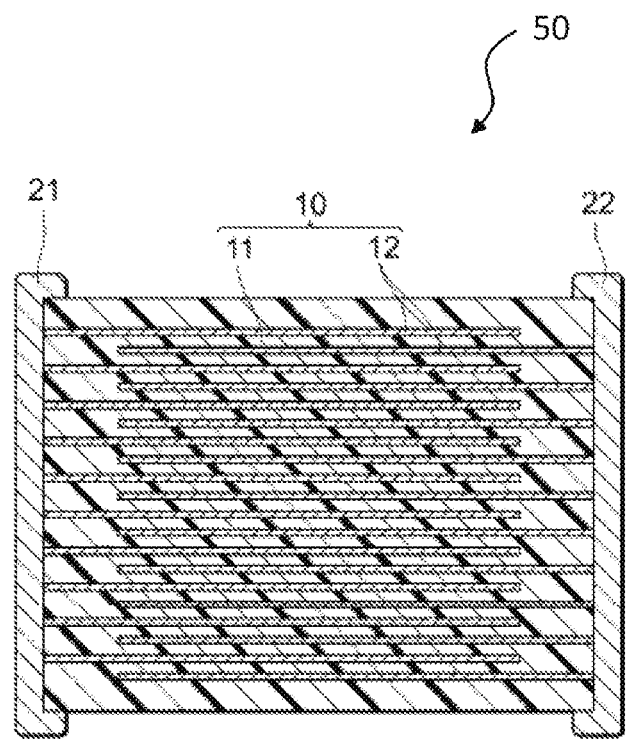

PIEZOELECTRIC COMPOSITION AND PIEZOELECTRIC ELEMENT

BACKGROUND OF THE INVENTION

The present invention relates to a piezoelectric composition and a piezoelectric element having the piezoelectric composition.

A piezoelectric composition has an effect (piezoelectric effect) of generating a charge on a surface due to receiving an external stress and an effect (converse piezoelectric effect) of generating a distortion due to applying an external electric field, on the basis of spontaneous polarization caused by a bias of charges in a crystal.

A piezoelectric element to which the piezoelectric composition capable of mutually converting mechanical energy and electric energy is applied has been widely used in various fields. For example, since an actuator as the piezoelectric element using the converse piezoelectric effect is used as a drive element of an optical system component, a head drive element of an HDD, a head drive element of an inkjet printer, a fuel injection valve drive element, and the like since a minute displacement can be accurately obtained in proportion to an applied voltage and a response speed is high.

The piezoelectric composition is also used as a sensor for reading a minute force or a deformation amount by using the piezoelectric effect. Further, since the piezoelectric composition has excellent responsiveness, it is possible to excite the piezoelectric composition itself or an elastic body in a bonding relationship with the piezoelectric composition to cause resonance by applying an alternating current electric field, and the piezoelectric composition is also used as a piezoelectric transformer, an ultrasonic motor, and the like.

Generally, the piezoelectric composition is composed of a polycrystalline body, and is obtained by subjecting a poling processing to the fired ferroelectric composition. In the ferroelectric composition after firing, a direction of the spontaneous polarization in each crystal is random, and as a whole ferroelectric composition, no bias of electric charge is generated, and the piezoelectric effect and the converse piezoelectric effect are not shown. Thus, by applying a direct current electric field equal to or higher than a coercive electric field to the ferroelectric composition after firing, an operation called the poling processing for aligning the direction of spontaneous polarization in a fixed direction is performed. The ferroelectric composition after the poling processing can exhibit properties as the piezoelectric composition.

As the piezoelectric composition, a lead-based piezoelectric composition including lead zirconate ($PbZrO_3$) and lead titanate ($PbTiO_3$) is often used. However, the lead-based piezoelectric composition contains about 60% by weight to 70% by weight of lead oxide (PbO) having a low melting point, and the lead oxide easily volatilizes during firing. Therefore, development of a lead-free piezoelectric composition has become an extremely important issue from a viewpoint of an environmental burden.

On the other hand, recently, as a lead-free environment-friendly piezoelectric composition, research has been conducted on an alkali metal niobate compound. For example, Patent Literature 1 discloses a piezoelectric composition having an alkali metal niobate compound as a main phase, and further having a first oxide phase containing Si and a second oxide phase containing a Group 2 element and a Group 4 element.

Patent Literature 1: Japanese Patent Laid-Open No. 2014-177355

BRIEF SUMMARY OF INVENTION

In order to sufficiently exhibit piezoelectric properties of a piezoelectric composition, a direction of spontaneous polarization needs to be aligned in a fixed direction in poling processing. Therefore, in the poling processing, a high voltage is applied to the piezoelectric composition. However, when the high voltage is applied, dielectric breakdown may occur in the piezoelectric composition, which is originally an insulator and a leakage current may occur. When such a leakage current occurs, the poling processing is not sufficiently performed, and the piezoelectric properties of the piezoelectric composition cannot be sufficiently exhibited. Therefore, the piezoelectric composition is required to have a good dielectric breakdown strength in order to exhibit predetermined piezoelectric properties.

The alkali metal niobate compound disclosed in Patent Literature 1 is evaluated for insulation resistance. However, the insulation resistance is an index indicating insulating property, and is generally measured at a low voltage that does not cause the dielectric breakdown. Therefore, Patent Literature 1 does not evaluate the insulating property in a state where a high voltage is applied as in the poling processing. In the alkali metal niobate compound, an alkali metal element volatilizes during firing, and a void, a defect, and the like are likely to occur inside the piezoelectric composition after firing. When the high voltage is applied to the piezoelectric composition, the dielectric breakdown may occur due to such void, defect, and the like. Therefore, it is very important whether the piezoelectric composition after firing has a predetermined dielectric breakdown strength.

The present invention has been made in view of these circumstances, and an object thereof is to provide a piezoelectric composition capable of achieving both a dielectric breakdown strength and an electromechanical coupling coefficient $k_{31}$, and a piezoelectric element including the piezoelectric composition.

In order to achieve the above object, the piezoelectric composition according to the present invention is

[1] a piezoelectric composition containing:
a complex oxide having a perovskite structure represented by a general formula of $ABO_3$;
copper; and
one or more elements selected from a group consisting of chromium, nickel and zinc, wherein
in $ABO_3$, an A-site element is potassium and a B-site element is niobium, or niobium and tantalum,
with respect to 1 mol of the complex oxide, a content ratio of the copper is α mol % in terms of CuO, a content ratio of the one or more elements selected from the group consisting of chromium, nickel and zinc is β mol % in terms of $CrO_{3/2}$, NiO, ZnO,
α satisfies a relationship of 0.2≤α≤2.5, and
β satisfies a relationship of 0.2≤β≤2.0.

[2] The piezoelectric composition according to [1], wherein $ABO_3$ is represented by a composition formula of $K_x(Nb_{1-y}Ta_y)O_3$, and x in the compositional formula satisfies a relationship of 0.980≤x≤0.999.

[3] The piezoelectric composition according to [1] or [2], wherein $ABO_3$ is represented by the composition formula of $K_x(Nb_{1-y}Ta_y)O_3$, and y in the composition formula satisfies a relationship of y≤0.100.

[4] A piezoelectric element including:
the piezoelectric composition according to any one of [1] to [3].

Since the piezoelectric composition according to the present invention has the above characteristics, it is possible to provide the piezoelectric composition capable of achieving both dielectric breakdown strength and electromechanical coupling coefficient $k_{31}$ and the piezoelectric element including the piezoelectric composition.

BRIEF DESCRIPTION OF THE DRAWINGS

FIG. 1 is a schematic perspective view of an example of a piezoelectric element according to an embodiment.

FIG. 2 is a schematic cross-sectional view of another example of the piezoelectric element according to the present embodiment.

DETAILED DESCRIPTION OF THE INVENTION

Hereinafter, the present invention will be described in detail in the following order based on specific embodiments.
1. Piezoelectric element
1.1. Piezoelectric composition
2. Method of manufacturing piezoelectric element
3. Effects in the present embodiment
4. Modified embodiments

1. Piezoelectric Element

First, a piezoelectric element to which the piezoelectric composition according to the present embodiment is applied will be described. The piezoelectric element is not particularly limited as long as it is an element to which the piezoelectric composition according to the present embodiment can be applied. In the present embodiment, a piezoelectric transformer, a thin film sensor, and a piezoelectric ultrasonic motor, etc. are exemplified.

A piezoelectric element 5 shown in FIG. 1 includes a plate-shaped piezoelectric part 1 and a pair of electrodes 2 and 3 formed on a pair of opposing surfaces 1a and 1b, which are both main surfaces of the piezoelectric part 1. The piezoelectric part 1 includes the piezoelectric composition according to the present embodiment. Details of the piezoelectric composition will be described later. The conductive material contained in the electrodes 2, 3 is not particularly limited, and can be arbitrarily set according to desired properties, use, etc. Gold (Au), silver (Ag), palladium (Pd), etc. are exemplified in the present embodiment.

Although the piezoelectric part 1 has a rectangular parallelepiped shape in FIG. 1, the shape of the piezoelectric part 1 is not particularly limited and can be arbitrarily set according to desired properties, use, etc. In addition, the size of the piezoelectric part 1 is not particularly limited, and can be arbitrarily set according to desired properties, use, etc.

The piezoelectric part 1 is poled in a predetermined direction. For example, in the piezoelectric element 5 shown in FIG. 1, it is polarized in the thickness direction of the piezoelectric part 1, namely, it is polarized in the direction in which the electrodes 2 and 3 are opposed. For instance, an external power supply (not shown) is electrically connected to the electrodes 2, 3, via wires (not shown), and a predetermined voltage is applied to the piezoelectric part 1 via the electrodes 2, 3. When voltage is applied, an electrical energy is converted into a mechanical energy by the converse piezoelectric effect in the piezoelectric part 1, and the piezoelectric part 1 can laterally vibrate in a lateral direction.

1.1. Piezoelectric Composition

The piezoelectric composition according to the present embodiment includes the complex oxide having a perovskite structure represented by a general formula of $ABO_3$ as a main component. According to the present embodiment, the main component is 90 mol % or more with respect to 100 mol % of the piezoelectric composition.

In the perovskite structure, an element having a large ion radius such as alkali metal elements, alkaline earth metal elements tend to occupy an A-site of $ABO_3$ while an element having a small ion radius such as transition metal elements tend to occupy a B-site of $ABO_3$. Then, the $BO_6$ oxygen octahedra including the B-site element and oxygen constitute a three-dimensional network in which the apexes of the $BO_6$ oxygen octahedra are shared, and the perovskite structure is formed by filling the A site element in the interstitial site of the network.

In the present embodiment, the general formula of $ABO_3$ can be represented by a compositional formula of $K_x(Nb_{1-y}Ta_y)O_3$. That is, the A-site element is potassium (K) and the B-site element is niobium (Nb) and tantalum (Ta).

In the above compositional formula, "x" indicates a ratio of the number of K atoms to the number of atoms of the element occupying the B-site. Therefore, "x" indicates a ratio of a total number of atoms of the A-site element to a total number of atoms of the B-site element, that is, a so-called A/B ratio. In the present embodiment, it is preferable that "x" satisfy a relationship of $0.980 \leq x \leq 0.999$. That is, it is preferable that the complex oxide having the perovskite structure represented by the general formula of $ABO_3$ is a B-site rich complex oxide. By setting "x" within the above range, both a dielectric breakdown strength and an electromechanical coupling coefficient $k_{31}$ can be further improved.

Further, it is more preferable that "x" is 0.985 or more, and it is further preferable that "x" is 0.991 or more. On the other hand, it is more preferable that "x" is 0.995 or less.

In the above composition formula, "y" indicates a ratio of the number of Ta atoms substituting Nb at the B-site. In the present embodiment, it is preferable that "y" satisfy a relationship of $0.000 < y \leq 0.100$. By setting "y" within the above range, the dielectric breakdown strength can be further improved.

Further, it is more preferable that "y" is 0.010 or more, and it is further preferable that "y" is 0.020 or more. By setting a lower limit of "y" to the above value, both the dielectric breakdown strength and the electromechanical coupling coefficient $k_{31}$ can be further improved. On the other hand, it is more preferable that "y" is 0.080 or less, and it is further preferable that "y" is 0.060 or less.

The piezoelectric composition according to the present embodiment contains copper (Cu) as a subcomponent. When a content of Cu in terms of CuO with respect to 1 mol (100 mol %) of the complex oxide is α mol %, it is preferable that the "α" satisfies a relationship of $0.2 \leq \alpha \leq 2.5$. Further, it is preferable that the "α" is 0.3 or more, and it is more preferable that the "α" is 0.5 or more. On the other hand, it is preferable that the "α" is 2.0 or less, and it is more preferable that the "α" is 1.5 or less. By containing Cu within the above range, the dielectric breakdown strength of the piezoelectric composition can be improved while maintaining the good electromechanical coupling coefficient $k_{31}$.

The piezoelectric composition according to the present embodiment contains, as the subcomponent, one or more elements selected from the group consisting of chromium (Cr), nickel (Ni), and zinc (Zn). When a content of Cr, Ni, and Zn in terms of $CrO_{3/2}$, NiO, and ZnO with respect to 1 mol (100 mol %) of the complex oxide is β mol %, it is preferable that the "β" satisfies a relationship of $0.2 \leq \alpha \leq 2.0$. Further, it is preferable that the "β" is 0.3 or more, and it is more preferable that the "β" is 0.4 or more. On the other hand, it is preferable that the "β" is 1.6 or less, and it is more preferable that the "β" is 1.2 or less. By containing one or more elements selected from the group consisting of Cr, Ni, and Zn within the above range, the electromechanical coupling coefficient $k_{31}$ and the dielectric breakdown strength can be improved.

The piezoelectric composition according to the present embodiment may contain, as the subcomponent, another subcomponent in addition to the above subcomponents. For example, at least one of a transition metal element (elements of Groups 3 to 11 in a long-period type Periodic Table) other than Nb, Ta, Cr, Ni and Cu described above, an alkaline earth metal element, elements of Group 12 in the long-period type Periodic Table other than Zn, and metal elements of Group 13 in the long-period type Periodic Table may be contained.

Specifically, examples of transition metal elements other than a rare earth element include iron (Fe), cobalt (Co), tungsten (W), molybdenum (Mo), and the like. Examples of rare earth elements include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and the like.

Examples of alkaline earth metal elements include magnesium (Mg), strontium (Sr), and the like. Examples of metal elements of Group 13 include aluminum (Al), gallium (Ga), indium (In), and the like.

It is preferable that the piezoelectric composition according to the present embodiment does not substantially contain sodium (Na) and lithium (Li). In particular, in the complex oxide having the perovskite structure represented by the general formula of $ABO_3$, it is preferable that Na and Li are not present as the A-site element. Specifically, when the general formula of $ABO_3$ is expressed as a composition formula of $(K_xNa_aLi_b)NbO_3$, it is preferable that "a" is 0.10 or less, "b" is 0.05 or less, and "a+b" is 0.15 or less.

Further, it is preferable that "x+a+b" satisfy a relationship of $0.980 \leq x+a+b \leq 0.999$. In this case, it is more preferable that "x+a+b" is 0.985 or more, and it is further preferable that "x+a+b" is 0.990 or more. On the other hand, it is more preferable that "x+a+b" is 0.995 or less.

Whether Na and/or Li are present as the A-site element in the perovskite structure can be determined based on, for example, whether a peak of a perovskite compound containing Na and/or Li is detected in an X-ray diffraction pattern obtained by XRD measurement.

The piezoelectric composition according to the present embodiment may contain lead (Pb) as an impurity, but it is preferable that a content thereof is 1% by weight or less, and it is more preferable that the piezoelectric composition does not contain Pb at all. This is because volatilization of Pb at a time of firing or release of Pb into an environment after an electronic apparatus mounting the piezoelectric element including the piezoelectric composition according to the present embodiment is distributed into a market and discarded can be prevented to a minimum from the viewpoint of low pollution, environmental resistance, and ecological point.

An average crystal grain size of crystal grains constituting the piezoelectric composition according to the present embodiment may be controlled from the viewpoint of the exhibiting of the piezoelectric properties and mechanical strength. In the present embodiment, it is preferable that the average crystal grain size is, for example, 0.5 μm to 20 μm.

2. Method of Manufacturing Piezoelectric Element

Next, an example of a method of manufacturing the piezoelectric element will be described.

First, a raw material for the piezoelectric composition is prepared. As the raw material for the complex oxide as a main component, a compound containing K and a compound containing Nb can be used, and a compound containing Ta can be used as necessary. Examples of the compounds containing K include a carbonate salt, a hydrogen carbonate compound, and the like. Examples of the compounds containing Nb and the compounds containing Ta include oxides and the like.

The raw material for copper, which is the subcomponent, may be either a simple substance of copper or a compound containing copper. In the present embodiment, it is preferable that the raw material for copper is an oxide containing copper. It is preferable that an average particle diameter of a raw material powder for copper is within a range of 0.1 μm to 5 μm.

A raw material for chromium, a raw material for nickel, and a raw material for zinc, which are subcomponents, are prepared. Similar to copper, these raw materials may be either simple substances of these metals alone or compounds containing these metals. In the present embodiment, it is preferable that these raw materials are oxides containing these metals. It is preferable that the average particle diameters of raw materials powders of these metals are within a range of 0.1 μm to 5 μm.

The prepared raw materials of the complex oxide are weighed at a predetermined ratio and then mixed for 5 hours to 20 hours using a ball mill and the like. As a mixing method, a wet mixing method or a dry mixing method may be used. In a case of wet mixing, a mixed powder is dried. Subsequently, the mixed powder or a molded body obtained by molding the mixed powder is subjected to heat processing (calcination) in an atmosphere at 750° C. to 1050° C. for 1 hour to 20 hours to obtain a calcined powder of the complex oxide.

The complex oxide constituting the obtained calcined powder has the perovskite structure represented by a general formula of $KNbO_3$ or $K(Nb,Ta)O_3$.

When the obtained calcined powder is aggregated, it is preferable that the calcined powder is pulverized for a predetermined time using the ball mill and the like to obtain a pulverized powder. The raw materials (raw material for copper, raw material for chromium, raw material for nickel, and raw material for zinc) for the subcomponent weighed at the predetermined ratio is added and mixed to the calcined powder or the pulverized powder to obtain a raw material powder of the piezoelectric composition. In the present embodiment, it is preferable that the mixing method is the ball mill, a bead mill, and the like.

A method of molding the raw material powder of the piezoelectric composition is not particularly limited, and may be appropriately selected according to a desired shape, size, and the like. When performing press molding, a predetermined binder and, if necessary, additives are added to the raw material powder of the piezoelectric composition and the mixture is molded into a predetermined shape to obtain a molded body. Further, the molded body may be obtained by using a granulated powder obtained by adding the predetermined binder and the like to the raw material powder of the piezoelectric composition and granulating the mixture. As necessary, the obtained molded body may be further subjected to pressure processing by CIP and the like.

The obtained molded body is subjected to binder removal treatment. As a binder removal condition, a holding temperature is preferably 400° C. to 800° C., and a temperature holding time is preferably 2 hours to 4 hours.

Subsequently, the molded body after the binder removal treatment is fired. As firing conditions, the holding temperature is preferably 950° C. to 1060° C., the temperature holding time is preferably 2 hours to 4 hours, temperature rising and cooling rates are preferably about 50° C./hour to 300° C./hour, and an atmosphere is preferably an oxygen-containing atmosphere.

The obtained piezoelectric composition as a sintered body is polished as necessary, and an electrode paste is applied and baked to form an electrode. A method of forming the electrode is not particularly limited, and an electrode may be formed by vapor deposition, sputtering, and the like.

The sintered body on which the electrode is formed is processed into a desired shape with a dicing saw, and an electric field of 2 kV/mm to 5 kV/mm is applied to the sintered body in oil at a predetermined temperature for about 5 minutes to about 1 hour to perform the poling processing. After the poling processing, the piezoelectric composition in which spontaneous polarization is aligned in a predetermined direction is obtained.

The piezoelectric composition after the poling processing is processed into a predetermined size as necessary to form the plate-shaped piezoelectric body 1. Next, the electrodes 2 and 3 are formed on the piezoelectric body 1 by vapor deposition and the like to obtain the piezoelectric element shown in FIG. 1.

3. Effect in the Present Embodiment

In the present embodiment, as the complex oxide having the perovskite structure contained as the main component in the piezoelectric composition, a potassium niobate compound having substantially no lithium (Li) and sodium (Na) in the perovskite structure is employed. Further, the piezoelectric composition contains copper (Cu) and one or more elements selected from the group consisting of chromium (Cr), nickel (Ni), and zinc (Zn) within a predetermined range. By setting the content of copper and the above elements within the predetermined range, the dielectric breakdown strength can be improved while maintaining good electromechanical coupling coefficient $k_{31}$, which is an important piezoelectric property.

As described above, the piezoelectric composition after firing is subjected to the poling processing. At this time, when an applied electric field intensity becomes low, a ratio of spontaneous polarization oriented in the fixed direction becomes small, and the piezoelectric properties of such a piezoelectric composition is lower than the piezoelectric properties obtained when the most of the spontaneous polarization are oriented in the fixed direction. Therefore, when the applied electric field intensity is increased, the dielectric breakdown may occur in the piezoelectric composition that is an insulator. Therefore, in order to sufficiently exhibit the piezoelectric properties inherent in the piezoelectric composition, it is necessary that the dielectric breakdown does not occur even when a high electric field intensity is applied enough to allow the most of the spontaneous polarization to be oriented in the fixed direction.

Therefore, since the piezoelectric composition according to the present embodiment has high dielectric breakdown strength, the poling processing can be sufficiently performed, and a potential of the piezoelectric composition can be sufficiently exhibited.

Such an effect is further improved by setting the A/B ratio in the complex oxide, that is, "x" within the above range. Further, by substituting Nb in the complex oxide with Ta at a predetermined ratio, such an effect is further improved.

4. Modified Embodiments

In the present embodiment described above, the piezoelectric element in which the piezoelectric part is a single layer has been described, but a piezoelectric element having a structure in which piezoelectric parts are laminated may be used. Further, a piezoelectric element having a combination of these may be used.

As the piezoelectric element having a structure in which piezoelectric parts are laminated, for example, the piezoelectric element 50 shown in FIG. 2 is exemplified. This piezoelectric element 50 includes a laminate 10 in which multiple piezoelectric layers 11 made of the piezoelectric composition according to the present embodiment and multiple internal electrodes 12 are alternately laminated. A pair of terminal electrodes 21 and 22 are formed on both end parts of the laminate 10 to be electrically connected to the internal electrode layers 12 alternately arranged inside the laminate 10.

The thickness (interlayer thickness) per one layer of the piezoelectric layers 11 is not particularly limited, and can be set arbitrarily according to desired properties, use, etc. Usually, the interlayer thickness is preferably about 1 µm to 100 µm. The number of layers of the piezoelectric layer 11 is not particularly limited, and can be arbitrarily set according to desired properties, use, etc.

As a method of manufacturing the piezoelectric element 50 shown in FIG. 2, a known method may be used. For example, a green chip to be the laminate 10 shown in FIG. 2 is prepared and fired to obtain a laminate 10. Then, terminal electrodes are printed or transferred to the laminate 10 and fired thereof. A general printing method and a sheet method each using paste are exemplified as methods for producing the green chip. In the printing method and the sheet method, a green chip is formed by using a paste prepared by mixing raw material powders of the above described piezoelectric composition and a vehicle in which a binder is dissolved in a solvent and forming a paint.

Although the present embodiment of the present invention has been described above, the present invention is not limited to the present embodiment described above, and modifications may be made in various ways within the scope of the present invention.

EXAMPLES

The present invention will be described in more detail below with reference to Examples and Comparative Examples. However, the present invention is not limited to the following examples.

First, a powder of potassium hydrogen carbonate ($KHCO_3$), a powder of niobium oxide ($Nb_2O_5$), and a powder of tantalum oxide ($Ta_2O_5$) were prepared as raw materials for a complex oxide ($K_x(Nb_{1-y}Ta_y)O_3$), which was a main component of a piezoelectric composition. A powder of copper oxide (CuO), a powder of chromium oxide ($Cr_2O_3$), a powder of nickel oxide (NiO) and a powder of zinc oxide (ZnO) were respectively prepare as a raw material of copper (Cu), a raw material of chromium (Cr), a raw material of nickel (Ni) and a raw material of zinc (Zn) as subcomponents contained in the piezoelectric composition.

The prepared raw materials were weighed so that the piezoelectric composition (sintered body) after firing had compositions shown in Table 1. Weighed powders of $KHCO_3$, $Nb_2O_5$ and $Ta_2O_5$ were mixed by a ball mill for 16 hours and then dried at 120° C. to obtain a mixed powder. The obtained mixed powder was press-molded and calcined at 1000° C. for 4 hours to obtain a calcined body of the complex oxide. Subsequently, the calcined body was pulverized for 16 hours by the ball mill to obtain a pulverized powder.

Each weighed powder of $CuO$, $Cr_2O_3$, $NiO$, and $ZnO$ was added to the obtained pulverized powder, mixed by the ball mill for 16 hours, and then dried at 120° C. to obtain a raw material powder of the piezoelectric composition. PVA as a binder was added to the obtained raw material powder of the piezoelectric composition, and granulated by a known method. Next, the obtained granulated powder was press molded with by applying a load of 196 MPa with a press molding machine to obtain a plate-shaped molded body.

The plate-shaped molded body thus obtained was subjected to binder removal treatment at 550° C. for 2 hours. The molded body after the binder removal treatment was fired in an air atmosphere at 1050° C. for 2 hours to obtain the piezoelectric composition (sintered body).

After the obtained sintered body was polished into a parallel plate shape with a thickness of 1.0 mm, and a silver paste was printed on both sides of the parallel plate-shaped sintered body, baking is performed at 800° C. to provide facing silver electrodes, and the resulting product was cut into a length of 12 mm and a width of 3 mm with a dicing saw to obtain a sample before poling processing.

The obtained sample before poling processing was subjected to the poling processing by applying an electric field of 3 kV/mm in silicone oil at 150° C. for 5 minutes to obtain samples for piezoelectric property evaluation (Examples 1 to 25, Comparative examples 1 to 4).

Dielectric breakdown strength and electromechanical coupling coefficient $k_{31}$ of the obtained sample before poling processing and the sample for piezoelectric property evaluation were measured as follows.

The dielectric breakdown strength was calculated as follows. An electric field applied to the obtained sample before poling processing was increased at a rate of 100 V/sec in silicone oil, and an electric field value when a current of 10 mA or more flowed was defined as the dielectric breakdown strength. In the present example, it was judged preferable when the sample has the dielectric breakdown strength of 5.0 kV/mm or more, and it was judged more preferable when the sample has the dielectric breakdown strength of 7.0 kV/mm or more. The results are shown in Table 1.

The electromechanical coupling coefficient $k_{31}$ of the obtained sample for piezoelectric property evaluation was calculated by measuring a resonance frequency fr and an anti-resonance frequency fa at room temperature using an impedance analyzer 4294A (manufactured by KEYSIGHT TECHNOLOGIES) in accordance with JEITA EM-4501M of Japan Electronics and Information Technology Industries Association Standard. In the present example, it was judged preferable when the sample has the $k_{31}$ of 14.0% or more, and it was judged more preferable when the sample has the $k_{31}$ of 16.0% or more. The results are shown in Table 1.

Table 1

| | Composition | | | | Properties | |
|---|---|---|---|---|---|---|
| | Main component | CuO | Subcomponent $CrO_{3/2}$, NiO, ZnO | | Dielectric breakdown | Electromechanical coupling coefficient |
| | $K_x(Nb_{1.000-y}Ta_y)O_3$ | | α | | strength | |
| Sample No. | x | y | (mol %) | Type | (mol %) | (kV/mm) | $K_{31}$ (%) |
|---|---|---|---|---|---|---|---|
| Example 1 | 0.995 | 0.000 | 0.2 | NiO | 0.5 | 5.1 | 19.0 |
| Example 2 | 0.995 | 0.000 | 0.5 | NiO | 0.5 | 5.3 | 18.0 |
| Example 3 | 0.995 | 0.000 | 0.8 | NiO | 0.5 | 5.4 | 16.7 |
| Example 4 | 0.995 | 0.000 | 1.0 | NiO | 0.5 | 5.8 | 14.9 |
| Example 5 | 0.995 | 0.000 | 1.5 | NiO | 0.5 | 5.9 | 14.2 |
| Example 6 | 0.995 | 0.000 | 2.0 | NiO | 0.5 | 5.4 | 14.1 |
| Example 7 | 0.991 | 0.000 | 0.8 | NiO | 0.5 | 6.0 | 16.8 |
| Example 8 | 0.995 | 0.000 | 0.8 | NiO | 0.2 | 5.5 | 16.9 |
| Example 9 | 0.995 | 0.000 | 0.8 | NiO | 0.5 | 5.7 | 17.6 |
| Example 10 | 0.995 | 0.000 | 0.8 | NiO | 1.0 | 5.7 | 17.9 |
| Example 11 | 0.995 | 0.000 | 0.8 | NiO | 1.5 | 5.4 | 15.5 |
| Example 12 | 0.995 | 0.000 | 0.8 | NiO | 2.0 | 5.4 | 15.5 |
| Example 13 | 0.995 | 0.000 | 0.8 | $CrO_{3/2}$ | 0.5 | 6.0 | 16.3 |
| Example 14 | 0.995 | 0.000 | 0.8 | ZnO | 0.5 | 6.4 | 16.0 |
| Example 15 | 0.995 | 0.000 | 0.7 | NiO ZnO | 0.5 0.2 | 5.5 | 16.8 |
| Example 16 | 0.995 | 0.000 | 0.7 | NiO $CrO_{3/2}$ | 0.5 0.2 | 5.5 | 16.1 |
| Example 17 | 0.995 | 0.002 | 0.8 | NiO | 0.5 | 6.7 | 16.7 |
| Example 18 | 0.995 | 0.010 | 0.8 | NiO | 0.5 | 7.2 | 17.2 |
| Example 19 | 0.980 | 0.050 | 0.8 | NiO | 0.5 | 7.3 | 17.3 |
| Example 20 | 0.995 | 0.050 | 0.8 | NiO | 0.5 | 7.8 | 18.1 |
| Example 21 | 0.999 | 0.050 | 0.8 | NiO | 0.5 | 7.8 | 17.9 |
| Example 22 | 0.995 | 0.100 | 0.8 | NiO | 0.5 | 7.5 | 16.3 |
| Example 23 | 0.995 | 0.200 | 0.8 | NiO | 0.5 | 5.6 | 14.1 |
| Example 24 | 0.975 | 0.020 | 0.8 | NiO | 0.5 | 6.5 | 16.4 |
| Example 25 | 1.003 | 0.020 | 0.8 | NiO | 0.5 | 5.5 | 14.2 |
| Comparative Example 1 | 0.980 | 0.000 | 0.8 | NiO | 0.1 | 4.7 | 16.5 |
| Comparative Example 2 | 0.980 | 0.000 | 0.8 | NiO | 2.2 | 5.2 | 13.2 |
| Comparative Example 3 | 0.980 | 0.000 | 0.1 | NiO | 0.5 | 4.0 | 19.1 |
| Comparative Example 4 | 0.980 | 0.000 | 2.5 | NiO | 0.5 | 5.3 | 12.0 |

From Table 1, in a potassium niobate compound having the perovskite structure, it was confirmed that, by setting a content ratio of Cu and a content ratio of one or more elements selected from Cr, Ni, and Zn within the above range, good dielectric breakdown strength and good electromechanical coupling coefficient $k_{31}$ can both be achieved.

Further, it was confirmed that, in a composition formula of $K_x(Nb_{1-y}Ta_y)O_3$, by setting "x", that is, an A/B ratio within the above range, the dielectric breakdown strength and the electromechanical coupling coefficient $k_{31}$ can be achieved at a higher level. Further, it was confirmed that, in the compositional formula of $K_x(Nb_{1-y}Ta_y)O_3$, by setting "y", that is, a substitution ratio of Ta to Nb within the above range, the dielectric breakdown strength and the electromechanical coupling coefficient $k_{31}$ can be achieved at a higher level.

The piezoelectric composition according to the present invention can be suitably used for the piezoelectric element in various fields since both high dielectric breakdown strength and good piezoelectric properties can be achieved at the same time.

5 Piezoelectric element
1 Piezoelectric part
2, 3 Electrode
50 Piezoelectric element
10 Multilayer body
11 Piezoelectric layer
12 Internal electrode layer
21, 22 Terminal electrode

What is claimed is:

1. A piezoelectric composition comprising:
   a complex oxide having a perovskite structure represented by a general formula of $ABO_3$;
   copper; and
   one or more elements selected from the group consisting of chromium, nickel and zinc,
   wherein in $ABO_3$, an A-site element is potassium and a B-site element is niobium, or niobium and tantalum,
   with respect to 1 mol of the complex oxide, a content ratio of the copper is α mol % in terms of CuO, a content ratio of the one or more elements selected from the group consisting of chromium, nickel and zinc is β mol % in terms of $CrO_{3/2}$, NiO, ZnO,
   α satisfies a relationship of 0.2≤α≤2.5, and
   β satisfies a relationship of 0.2≤β≤2.0.

2. The piezoelectric composition according to claim 1, wherein $ABO_3$ is represented by a composition formula of $K_x(Nb_{1-y}Ta_y)O_3$,
   x in the compositional formula satisfies a relationship of 0.980≤x≤0.999, and
   y in the composition formula satisfies a relationship of 0≤y≤0.100.

3. The piezoelectric composition according to claim 2, wherein $ABO_3$ is represented by the composition formula of $K_x(Nb_{1-y}Ta_y)O_3$, and y in the composition formula satisfies a relationship of 0<y≤0.100.

4. A piezoelectric element comprising:
   the piezoelectric composition according to claim 1.

* * * * *